US007858063B2

(12) United States Patent
Baluais et al.

(10) Patent No.: US 7,858,063 B2
(45) Date of Patent: Dec. 28, 2010

(54) HIGH PURITY METALLURGICAL SILICON AND METHOD FOR PREPARING SAME

(75) Inventors: Gerard Baluais, Chedde (FR); Yves Caratini, Chedde (FR); Yves Delannoy, Crolles (FR); Christian Trassy, Grenoble (FR)

(73) Assignee: Invensil, Chambery (FR)

( * ) Notice: Subject to any disclaimer, the term of this patent is extended or adjusted under 35 U.S.C. 154(b) by 1265 days.

(21) Appl. No.: 10/484,311

(22) PCT Filed: Jul. 22, 2002

(86) PCT No.: PCT/FR02/02602

§ 371 (c)(1),
(2), (4) Date: Jan. 20, 2004

(87) PCT Pub. No.: WO03/014019

PCT Pub. Date: Feb. 20, 2003

(65) Prior Publication Data

US 2005/0053539 A1   Mar. 10, 2005

(30) Foreign Application Priority Data

Jul. 23, 2001   (FR) .................................. 01 09788

(51) Int. Cl.
*C01B 33/02* (2006.01)
(52) U.S. Cl. .................. 423/349; 423/324; 423/348; 423/350
(58) Field of Classification Search ................. 423/324, 423/348, 349, 350
See application file for complete search history.

(56) References Cited

U.S. PATENT DOCUMENTS

| 3,715,203 | A | * | 2/1973 | De Bie ........................ 75/650 |
| 4,193,975 | A | | 3/1980 | Kotval et al. |
| 4,298,423 | A | * | 11/1981 | Lindmayer .................... 23/296 |
| 4,379,777 | A | * | 4/1983 | Boulos ........................ 423/348 |
| 4,747,906 | A | * | 5/1988 | Shingu et al. ................. 23/301 |
| 4,837,376 | A | | 6/1989 | Schwirtlich et al. |
| 4,900,532 | A | * | 2/1990 | Kurz et al. ................... 423/348 |
| 4,948,102 | A | * | 8/1990 | Otsuka et al. ................ 266/205 |
| 5,510,095 | A | * | 4/1996 | Aratani et al. ............... 423/348 |
| 6,720,268 | B1 | * | 4/2004 | Laermer et al. .............. 438/700 |

FOREIGN PATENT DOCUMENTS

| EP | 0459421 | 12/1991 |
| EP | 0477784 | 4/1992 |
| FR | 2585690 | 2/1987 |
| FR | 2772741 | 6/1999 |
| JP | 05-262512 | * 10/1993 |

OTHER PUBLICATIONS

Yuge et al., "Purification of Metallurgical-Grade Silicon up to Solar Grade." Progress in Photovltaics: Research and Applications, 2001.*
Machine Translation of JP 05-262512.*
Database WPI, Section Ch, Week 199234, Derwent Publications Ltd., London, Great Britain, AN 1992-281549, Article No. XP002194088.
Search Report.

* cited by examiner

Primary Examiner—Steven Bos
Assistant Examiner—Paul A Wartalowicz
(74) Attorney, Agent, or Firm—Connolly Bove Lodge & Hutz LLP

(57) ABSTRACT

The invention concerns a silicon designed in particular for making solar cells containing a total of impurities ranging between 100 and 400 ppm, a boron content ranging between 0.5 and 3 ppm, a phosphorus/boron content ratio ranging between 1 and 3, and a content of metal elements ranging between 30 and 300 ppm. The invention also concerns a method for making such a silicon from an oxygen- or chorine-refined metallurgical silicon containing at least 500 ppm of metal elements, and comprising: refusion under neutral atmosphere of the refined silicon, in an electric furnace equipped with a hot crucible; transferring the molten silicon, to provide a plasma refining, in an electric furnace equipped with a hot crucible; plasma refining with as plasma-forming gas a mixture of argon and of at least a gas belonging the group consisting of chlorine, fluorine, HCI and HF; casting under controlled atmosphere in an ingot mold wherein is produced segregated solidification.

16 Claims, No Drawings

HIGH PURITY METALLURGICAL SILICON AND METHOD FOR PREPARING SAME

FIELD OF THE INVENTION

The invention relates to a high purity metallurgical silicon with different applications including the manufacture of panels for conversion of light energy, and particularly solar energy, into electrical energy. The invention also relates to the process for making this material called photovoltaic silicon.

STATE OF THE ART

There are many applications of high purity silicon and there are particular specifications for each. The purity required for the photovoltaic application may extend over a relatively wide range, since the energy efficiency and the behaviour of solar cells when aging depend on the quality of the high purity silicon used, which leaves solar panel manufacturers possibilities for making choices in terms of the quality/price ratio.

For a long time, declassified products derived from the production of electronic silicon have formed the main source of photovoltaic quality silicon, but this source is insufficient to supply the increasing market demand, so that other silicon sources are necessary such as metallurgical silicon produced by carbothermal reduction of silica in an electric arc furnace, and used mainly as a raw material in chemistry and as an aluminium alloying element. However, the specifications for the quality of metallurgical silicon used for synthesis of chlorosilanes, a raw material used in making silicones, are very different from the specifications for photovoltaic silicon, and it can only be envisaged for this application if the refining done is very pure. The cost of this refining increases very quickly with the degree of purity, the cost of electronic quality silicon is thus of the order of 30 times the cost of metallurgical silicon.

The specifications required by the photovoltaic application depend on the qualities requested for cells; the specification for a silicon necessary to obtain the best performances are boron <3 ppm, phosphorus <10 ppm, total metallic impurities <300 ppm, and preferably <150 ppm.

The cost of refining to obtain this degree of purity remains high and is not very competitive for a photovoltaic application. One of the techniques for refining liquid silicon is plasma refining that has been developing gradually and that provides a means of lowering the boron and phosphorus contents to values of a few ppm.

Patent FR 2585690 by Rhône-Poulenc Spécialités Chimiques describes a two step refining process comprising plasma melting using a hydrogen-argon mix as the plasma-forming gas, followed by plasma refining with a hydrogen-argon-oxygen mix as a gas. This technique has several disadvantages:
- firstly it uses hydrogen at high temperature, which in an industrial use of the process can cause hydrogen leaks and therefore safety problems that are difficult to solve,
- the problem of making plasma melting, for which productivity is low,
- the problem of using oxygen that generates slag during the treatment, the said slag forms a barrier between the liquid silicon being refined and the plasma constituents, which slows the refining rate. Furthermore, this slag gradually collects on the edges of the crucible to form a solid slag ring at the surface of the liquid, which means that slagging off will be necessary later on. Repeated slagging off during operations damages the crucibles and weakens them and reduces their life.

Patent EP 0.459.421 (Kawasaki Steel) describes refining of silicon by plasma in a siliceous crucible, or a crucible coated with a siliceous refractory lining, using an inert gas as a plasma-forming gas to which 0.1 to 10% of water vapour is added, and optionally silica powder in a proportion less than 1 kg of silica per $Nm^3$ of gas.

As in the previous case, this operating method encourages the formation of an oxide film on the silicon surface, which has the consequence of slowing the refining rate. The patent even specifies that an oxygen content of 0.05% in the molten silicon should not be exceeded.

Furthermore, the fact of using a blown plasma or transferred plasma torch introduces impurities in the silicon, since wear of the torch cathode due to volatilisation of the metal of which it is composed contributes to polluting the plasma formed which in turn pollutes the silicon.

CNRS Patent FR 2.772.741 describes refining of liquid silicon with a gaseous chlorine-hydrogen-water vapour mix that has the same disadvantages as in the previous case, particularly a very low solid silicon melting rate, and also has the disadvantage of working with a cold crucible that introduces large heat losses and very high energy consumptions of the order of 50 000 kWh/t to 100 000 kWh/t, whereas 8100 kWh/t is sufficient for manufacturing liquid silicon by carboreduction of silica, and melting of solid silicon only requires 900 kWh/t. Furthermore, the cold crucible technique cannot be used to design industrial sized tools.

Therefore, the purpose of the invention is to obtain silicon derived from metallurgical silicon with a purity acceptable for use as a photovoltaic material, and an economic process for making this material on an industrial scale from metallurgical silicon.

PURPOSE OF THE INVENTION

The invention concerns a silicon designed in particular for making solar cells, with a total content of impurities ranging between 100 and 400 ppm and preferably between 100 and 250 ppm, a content of metallic elements between 30 and 300 ppm and preferably between 30 and 150 ppm, a boron content ranging between 0.5 and 3 ppm, and preferably between 0.5 and 2 ppm, and a phosphorus/boron ratio ranging between 1 and 3.

The invention also concerns a method for making a silicon of this quality from an oxygen or chlorine refined metallurgical silicon containing less than 500 ppm of metal elements and comprising:
- remelting of the solid silicon containing less than 500 ppm of metallic elements under a neutral atmosphere, in an electric furnace equipped with a hot crucible,
- transfer of the molten silicon for plasma refining, in an electric furnace equipped with a hot crucible,
- plasma refining with a mixture of argon and at least one gas from the group consisting of chlorine, fluorine, hydrochloric acid and hydrofluoric acid, as plasma-forming gas,
- casting under controlled atmosphere in an ingot mould, in which segregated solidification takes place.

A metallurgical silicon containing less than 500 ppm of metallic elements is preferably prepared using a first segregated solidification operation.

DESCRIPTION OF THE INVENTION

Research carried out by the applicant has showed that under some conditions and for some elements, a degree of purity less than the degree of purity for electronic quality silicon is sufficient for photovoltaic silicon, and can give good performances for photovoltaic cells.

Thus, phosphorus appears to be a significantly less disturbing element than boron and a phosphorus content of up to 10 ppm can be accepted without excessively degrading the performance of cells. Furthermore, impurities other than group III and V elements in the Mendeleïev's classification have a minor importance on cell performances and a silicon containing a total amount of impurities of less than 400 ppm, a boron content of between 0.5 and 3 ppm and a phosphorus content of between 1 and 3 times the boron content gives excellent results, provided that the total of all metallic impurities remains below 300 ppm and preferably below 150 ppm.

A material of this type is very useful if it can be produced at a competitive cost, in other words very much less expensive than electronic quality silicon. The manufacturing process according to the invention satisfies this need. The basic raw material is metallurgical silicon produced industrially by carbothermal reduction of quartz in an electric arc furnace, and more precisely the "chemical" quality that will be used for synthesis of chlorosilanes for manufacturing silicones. This grade is obtained using an oxidising refining of metallurgical silicon in the liquid state and provides a means of achieving specifications for example such as Fe<0.30%, Ca<0.10%, Al<0.30%. Boron contents are usually between 20 and 50 ppm and phosphorus contents are between 30 and 100 ppm. This type of material also contains other impurities, particularly titanium, carbon and oxygen, but also vanadium, chromium, manganese, nickel and copper in trace state.

The use of a chlorine refining process like that described by the applicant in patent EP 0.720.967 already provides a means of achieving oxygen levels of 400 ppm on liquid silicon. Experience has also shown that this type of refining can achieve carbon levels of the order of 100 ppm.

Moreover, access to low iron raw materials, and the development of the composite electrodes technology, now enables a significant reduction of iron contents in metallurgical silicon; moreover, the segregation technique during solidification can help to further significantly reduce iron contents in this type of silicon, if it should be necessary.

The next step after this first oxygen or chlorine refining is segregated solidification, if necessary, to separate a solid silicon containing less than 500 ppm of metallic elements and concentrate the metallic impurities in an enriched liquid silicon containing 0.5 to 1% of metallic elements. Cooling of the poured mass is controlled to limit the front advance velocity, that must remain below $2 \times 10^{-5}$ m/s and preferably below $10^{-5}$ m/s; and 48 to 52% of the solid silicon is obtained with less than 500 ppm of metallic elements.

The next step is remelting of solid silicon containing less than 500 ppm of metallic elements, by batch under a neutral atmosphere such as argon, in an electric furnace, and preferably an induction furnace, in a conventional hot crucible made either of carbon or graphite or silicon carbide, or with a refractory lining composed of sintered silica. The electric generator supplying electrical power to the induction furnace operates at frequencies typically between 500 and 5000 Hz, depending on the crucible diameter. A heel is kept after each pour to facilitate restarting the next operation.

The molten silicon is then transferred into a second electric furnace, preferably an induction furnace equipped with the same type of crucible for the plasma refining. The plasma is obtained by an inductive torch powered by an electricity source at a frequency of between 100 kHz and 4 MHz. The plasma-forming gas used for this operation is composed of a mix of argon and chlorine, fluorine, hydrochloric or hydrofluoric acid, the proportion of argon used being between 5 and 90% and preferably between 50 and 70%. Under these conditions, refining of silicon leads to the formation of gaseous compounds which avoids the formation of liquid or solid slag in the furnace crucible. Start up of the operation can be facilitated by adding a small amount of anhydrous magnesium chloride on the silicon surface, without disturbing refining.

The next step is pouring into an ingot mould under a controlled inert atmosphere, in which a second segregated solidification operation is carried out; cooling of the cast mass is controlled so that the front advance velocity at this stage of the process can be controlled and remains below $10^{-5}$ m/s and preferably below $5 \times 10^{-6}$ m/s. The proportion of solid silicon obtained with less than 300 ppm of metallic impurities is between 80% and 86% and the proportion of remaining liquid silicon enriched with metallic elements is between 14% and 20%.

The liquid silicon is preferably transferred between the remelting operation and the plasma refining operation by displacement of the assembly composed of the casing of the induction furnace containing an induction coil, the crucible, and liquid silicon, from the remelting station as far as the plasma treatment station. This assembly is built so that it can be quickly disconnected from and reconnected to 500 Hz-5000 Hz static electricity generators installed on the melting station and the plasma treatment station. The plasma treatment station is also equipped with a fixed inductive plasma torch and its electric generator, that is also fixed. This arrangement of the equipment and this procedure are designed to avoid reladling of liquid silicon.

This complete system is capable of preparing about 48 to 52% of silicon containing 0.5 to 1% of metallic impurities, 7 to 10% of silicon containing 500 to 1500 ppm of metallic impurities and 40 to 43% of high purity silicon according to the invention, starting from silicon containing 0.25% of iron, 0.10% of calcium, 0.30% of aluminium, 20 to 50 ppm of boron and 30 to 100 ppm of phosphorus.

Energy consumption is approximately 7000 kWh/t of high purity silicon, plus about 11000 kWh/t necessary to produce the basic material, giving a total of the order of 18000 kWh/t for the high purity silicon obtained.

The composition of the high purity silicon obtained by this process is as follows:

Boron 0.5 to 3 ppm; Phosphorus/Boron ratio between 1 and 3;

Total impurities: 100 to 400 ppm

Total metallic impurities: 30 to 300 ppm, Fe 10 to 200 ppm,

Carbon 20 to 50 ppm; Oxygen 50 to 100 ppm;

Calcium 5 to 30 ppm; Aluminium 5 to 30 ppm; Titanium 2 to 20 ppm.

A high purity silicon with a significantly better quality can be obtained by increasing the duration of the plasma treatment:

Boron 0.5 to 2 ppm; Phosphorus/Boron ratio between 1 and 3;

Total impurities: 100 to 250 ppm,

Total metallic impurities 30 to 150 ppm, Fe 10 to 20 ppm,

Carbon 10 to 30 ppm; Oxygen 20 to 50 ppm;

Calcium 5 to 10 ppm; Aluminium 5 to 10 ppm; Titanium 2 to 5 ppm.

EXAMPLES

Example 1

A 2 t ladle of liquid silicon was taken from the silicon production from an electric submerged arc furnace, and oxidising refining was carried out on it; the liquid silicon sampled in the ladle gave the following ICP analysis:

Iron=0.24%; Calcium=98 ppm; Aluminium=245 ppm; Titanium=240 ppm; Boron=32 ppm; Phosphorus=19 ppm; Carbon=100 ppm; Oxygen=1200 ppm.

Some of the liquid silicon was poured in an ingot mould made of sintered silica equipped with a pouring spout with a capacity of 600 kg of silicon; this ingot mould with an area of 2 m² was placed in an electrically heated reverberatory furnace using graphite bars acting as resistances, heat losses from the furnace taking place mainly through the hearth. The furnace power was adjusted to 40 kW to achieve 50% solidification of the silicon in about 1.25 h. After 75 minutes waiting, the liquid remaining in the ingot mould was poured through the spout and produced a 290 kg ingot.

The mass of solid silicon remaining in the ingot mould was 294 kg and its analysis was: Iron=285 ppm; Calcium=24 ppm; Aluminium=14 ppm; Titanium:=9 ppm; Boron=28 ppm; Phosphorus=10 ppm; Carbon=100 ppm; Oxygen=800 ppm. The operation was repeated several times to obtain a sufficient quantity of this quality of silicon.

The silicon obtained was remelted in 200 kg batches under an argon atmosphere in a 250 kW induction furnace operating at 1200 Hz beginning with a metallurgical liquid silicon heel; the production from the first three batches was discarded to be sure that the furnace was correctly flushed.

The production from the next batches was transferred batch by batch from the remelting station to the plasma treatment station for refining treatment by completely transferring the assembly composed of the casing of the furnace, the induction coil, the crucible, and liquid silicon. The plasma treatment station is equipped with a generator identical to the generator in the remelting station and a fixed assembly comprising an inductive plasma torch and a 150 kHz generator. The torch is powered by a gas mix composed of 40% HCl and 60% argon. The treatment duration was 1 h per batch.

Each plasma treated silicon batch was then solidified and segregated in an 0.67 m² ingot mould provided with a pouring spout and placed in a reverberatory furnace electrically heated by graphite bars acting as resistances, heat losses from the furnace taking place mainly through the hearth. The power of the furnace was held at 45 kW. The liquidus was poured after 3 hours waiting. The poured mass resulted in a 36 kg ingot, while the mass of recovered solidified silicon was 162 kg.

Liquid sampling was done on the raw plasma treated silicon and the analysis results were as follows:

Iron=280 ppm; Calcium=23 ppm; Aluminium=14 ppm; Titanium=9 ppm; Boron=3 ppm; Phosphorus=8 ppm; Carbon=50 ppm; Oxygen=80 ppm.

The results of the analysis on the solid silicon obtained after segregation after plasma refining were as follows:

Iron=160 ppm; Calcium=9 ppm; Aluminium=8 ppm; Titanium=5 ppm; Boron=3 ppm; Phosphorus=8 ppm; Carbon=50 ppm; Oxygen=90 ppm.

Example 2

The test in example 1 was repeated, attempting to get the best possible quality of the final silicon from this process.

A 2 t ladle of liquid silicon was sampled from the production of silicon from a submerged arc electric furnace and a chlorine refining treatment was carried out on it; the results of the analysis on the sampled liquid silicon in the ladle were as follows:

Iron=0.25%; Calcium=90 ppm; Aluminium=210 ppm; Titanium=240 ppm; Boron=32 ppm; Phosphorus=20 ppm; Carbon=100 ppm; Oxygen=400 ppm.

This ladle was then treated at low pressure for 30 minutes with argon injection into the bottom of the ladle through a porous brick; the argon flow was 0.7 Nm³/hour.

Some of the liquid silicon thus obtained was poured into a sintered silica ingot mould provided with a pouring spout with a capacity of 600 kg of silicon; this ingot mould with an area of 2 m² was placed in a reverberatory furnace electrically heated using graphite bars acting as resistances, heat losses from the furnace taking place mainly through the hearth. The furnace power was adjusted to 50 kW so that about 50% of the silicon was solidified in the ingot mould in about 2.5 h.

After 150 minutes waiting, the liquid remaining in the ingot mould was poured through the spout and produced a 290 kg ingot. The mass of the solid silicon remaining in the ingot mould was 295 kg and the result of the analysis was:

Iron=95 ppm; Calcium=23 ppm; Aluminium=12 ppm; Titanium=9 ppm; Boron=32 ppm; Phosphorus=6 ppm; Carbon=100 ppm; Oxygen=400 ppm.

The operation was repeated several times in order to obtain a sufficient quantity of silicon of this quality.

The silicon obtained was remelted in 200 kg batches under an argon atmosphere in a 250 kW induction furnace operating at 1000 Hz, beginning with a metallurgical liquid silicon heel; production from the first three batches was discarded to be sure that the furnace was correctly flushed.

The production from the next batches was transferred batch by batch for refining treatment under the same conditions as in example 1. The treatment duration was 2 h per batch.

Each plasma treated silicon batch was then subjected to a segregated solidification in an 0.67 m² ingot mould equipped with a pouring spout and placed in a reverberatory furnace electrically heated by graphite bars acting as resistances, heat losses from the furnace taking place mainly through the hearth. The power of the furnace was held at 55 kW. The liquidus was poured after 6 hours waiting. The poured mass resulted in a 30 kg ingot, while the mass of recovered solidified silicon was 164 kg.

Liquid sampling was done on the raw plasma treated silicon and the analysis results were as follows:

Iron=85 ppm; Calcium=23 ppm; Aluminium=12 ppm; Titanium=9 ppm; Boron=2 ppm; Phosphorus=5 ppm; Carbon=30 ppm; Oxygen=50 ppm.

The results of the analysis on the solid silicon obtained after segregation after plasma refining were as follows:

Iron=16 ppm; Calcium=9 ppm; Aluminium=7 ppm; Titanium=4 ppm; Boron=2 ppm; Phosphorus=5 ppm; Carbon=30 ppm; Oxygen=50 ppm.

The invention claimed is:

1. Method for making a photovoltaic quality silicon from an oxygen or chlorine refined metallurgical silicon containing less than 500 ppm of metal elements and comprising:

remelting of the refined silicon, under a neutral atmosphere, in an electric furnace equipped with a hot crucible, transfer of the remelted silicon for plasma refining, in an electric furnace equipped with a hot crucible, plasma refining of the molten silicon using a plasma forming gas consisting of 5 to 90% of argon mixed with at least one gas from the group consisting of chlorine, fluorine, hydrochloric acid and hydrofluoric acid, and casting under controlled atmosphere in an ingot mould, in which segregated solidification takes place.

2. The method according to claim 1, wherein the refined silicon is prepared with less than 500 ppm of metallic elements, using a segregated solidification operation to concentrate the metallic impurities in the liquid fraction.

3. The method according to claim 1, wherein the remelting is done on successive batches.

4. The method according to claim 1, wherein the remelting and plasma refining of silicon are done in two different workstations.

5. The method according to claim 1, wherein the silicon is transferred between the remelting operation and the plasma refining operation by displacement of an assembly composed of a casing of the furnace, an induction coil, a crucible, and liquid silicon.

6. The method according to claim 1, wherein the plasma refining is done using an HF-argon and/or HCl-argon gas mix containing between 50% and 70% argon.

7. The method according to claim 1, wherein the plasma source is an inductive torch powered by an electricity source at a frequency of between 100 kHz and 4 MHz.

8. The method according to claim 2, wherein the first segregated solidification, before plasma refining, is controlled so that the solidification front advance velocity is below $2 \times 10^{-5}$ m/s.

9. The method according to claim 1, wherein the segregated solidification, after plasma refining, is controlled so that the solidification front advance velocity is below $10^{-5}$ m/s.

10. The method according to claim 9, wherein the solidification front advance velocity is below $5 \times 10^{-6}$ M/s.

11. The method according to claim 1, wherein the segregated solidification operations take place in a reverberatory furnace.

12. The method according to claim 1, wherein electric furnaces are used for silicon remelting and plasma refining operations wherein the electric furnaces are induction furnaces.

13. The method according to claim 1, wherein electric furnace crucibles are used for silicon remelting and plasma refining operations wherein the electric furnace crucibles are made either of silica, carbon, graphite, or silicon carbide.

14. The method according to claim 2, wherein remelting is done on successive batches.

15. The method according to claim 2, wherein the remelting and plasma refining of silicon are done in two different workstations.

16. The method according to claim 3, wherein the remelting and plasma refining of silicon are done in two different workstations.

* * * * *